United States Patent
Jeong

(10) Patent No.: US 10,168,813 B2
(45) Date of Patent: Jan. 1, 2019

(54) FLEXIBLE TOUCH PANEL AND ORGANIC LIGHT EMITTING DISPLAY DEVICE USING THE SAME

(71) Applicant: LG DISPLAY CO., LTD., Seoul (KR)

(72) Inventor: Hae-Yeon Jeong, Osan-si (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 15/799,439

(22) Filed: Oct. 31, 2017

(65) Prior Publication Data
US 2018/0120998 A1    May 3, 2018

(30) Foreign Application Priority Data
Oct. 31, 2016 (KR) .................. 10-2016-0143883

(51) Int. Cl.
| | | |
|---|---|---|
| G06F 3/00 | (2006.01) | |
| G06F 3/041 | (2006.01) | |
| G06F 3/044 | (2006.01) | |
| H01L 27/32 | (2006.01) | |
| H01L 51/00 | (2006.01) | |
| H01L 51/52 | (2006.01) | |

(52) U.S. Cl.
CPC ............ G06F 3/0412 (2013.01); G06F 3/044 (2013.01); H01L 27/323 (2013.01); H01L 27/3279 (2013.01); H01L 51/0097 (2013.01); H01L 51/5246 (2013.01); *G06F 2203/04102* (2013.01); *G06F 2203/04103* (2013.01); *G06F 2203/04111* (2013.01); *H01L 2251/5338* (2013.01)

(58) Field of Classification Search
CPC .............. G06F 3/0412; G06F 3/044; G06F 2203/04102; G06F 2203/04103; G06F 2203/04111; H01L 27/323; H01L 51/0097; H01L 51/5246; H01L 27/3279; H01L 2251/5338
See application file for complete search history.

(56) References Cited

U.S. PATENT DOCUMENTS

2010/0311494 A1* 12/2010 Miller .................. A63F 1/18
463/22
2013/0278542 A1* 10/2013 Stephanou ............ G06F 3/0414
345/174

* cited by examiner

*Primary Examiner* — Muhammad N Edun
(74) *Attorney, Agent, or Firm* — Birch, Stewart, Kolasch & Birch, LLP

(57) ABSTRACT

Disclosed are a flexible touch panel, a structure of which is changed to prevent cracks in touch wirings, and an organic light emitting display device using the same. The flexible touch panel includes transparent capping electrodes including at least three intersection points between first wirings and second wirings in each of adjacent first blocks and thus overlapping bridge electrodes.

20 Claims, 13 Drawing Sheets

ROUTING PAD
PART PART

ROUTING PAD
PART PART

FLEXIBLE TOUCH PANEL AND ORGANIC LIGHT EMITTING DISPLAY DEVICE USING THE SAME

This application claims the priority benefit of Korean Patent Application No. 10-2016-0143883, filed on Oct. 31, 2016, the disclosure of which is hereby incorporated by reference in its entirety.

BACKGROUND OF THE INVENTION

Field of the Invention

Embodiments of the present invention relate to a display device, and more particularly, to a flexible touch panel, a structure of which is changed to prevent cracks in touch wirings and to improve reliability of a device, and an organic light emitting display device using the same.

Discussion of the Related Art

As representative examples of display devices, there are liquid crystal displays (LCDs), organic light emitting displays, plasma display panels (PDPs), quantum dot displays, field emission displays (FEDs), elctrophoretic displays (EPDs), etc. Each of these display devices essentially includes a flat display panel displaying an image, and the flat display panel is prepared by bonding a pair transparent insulating substrates by an intrinsic light emitting layer, a polarizing layer or an optical material layer interposed therebetween.

Among these display devices, organic light emitting display devices, which may have light weight through omission of a light source and sufficiently express colors, are in the spotlight now.

Further, as display devices are becoming increasingly large, the display devices require low space occupation. Such requirements are gradually increased and flexible display devices are required.

Therefore, flexible display devices including bendable or rollable display devices, which have a slim thickness and are thus bendable, foldable or rollable, are being developed.

Further, display devices require inclusion of a touch panel having a touch detection function as well as a display function so as to satisfy a user's specific requirements.

Therefore, an organic light emitting display device in which a touch panel is bonded to an organic light emitting diode array has been proposed.

However, the touch panel is located on a surface of the organic light emitting display device, which a user contacts, thus being vulnerable to impact. Further, if the organic light emitting display device is implemented as a flexible device, electrodes or wirings corresponding to a folding or bending axis may be cut and thereby defects in sensing touch is observed.

That is, if the organic light emitting display device is implemented as a flexible device, a flexible touch panel which can bend without cracking so as to cope with flexibility of the device is required.

SUMMARY OF THE INVENTION

Accordingly, the present invention is directed to a flexible touch panel and an organic light emitting display using the same that substantially obviate one or more problems due to limitations and disadvantages of the related art.

An object of the present invention is to provide a flexible touch panel, a structure of which is changed to prevent cracks in touch wirings and to improve reliability of a device, and an organic light emitting display device using the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a flexible touch panel includes a flexible base substrate, a first block array including a plurality of first blocks formed by a first intersection between a plurality of first wirings and a plurality second wirings, on the flexible base substrate each first block being spaced apart from one another in a first direction, a second block array including a plurality of second blocks formed by an intersection between a plurality of third wirings and a plurality fourth wirings on the flexible base substrate, each second block being disposed in a second direction, bridge electrodes overlapping the plurality of first wirings and the plurality of second wirings at facing parts of adjacent first blocks of the first block array, connection electrodes in the same layer as the plurality of third wirings and the plurality of fourth wirings and connected integrally with the plurality of third wirings and the plurality of fourth wirings of the adjacent second blocks, and transparent capping electrodes including at least three intersection points between the first wirings and the second wirings in each of the adjacent first blocks of the first block array and overlapping the bridge electrodes.

In regions provided with the transparent capping electrodes, contact holes may be formed at between the bridge electrodes and at least three intersection points of the plurality of first wirings and the plurality of second wirings, and the bridge electrodes may be connected to the at least three intersection points with the plurality of first wirings and the plurality of second wirings.

The transparent capping electrodes may have a shape covering a single rectangular area formed by intersection of two first wirings and two second wirings in each of the first blocks.

The connection electrodes are located in separation regions between the adjacent first blocks. In this instance, the connection electrodes may include first connection wirings and second connection wirings intersecting each other in the same shape as the intersecting shape between the plurality of third wirings and the plurality of fourth wirings. In this instance, the bridge electrodes may overlap the first connection wirings and the second connection wirings. Further, an interlayer insulating film may be provided in between a first layer of the first connection wirings and the second connection wirings and a second layer of the bridge electrodes.

The flexible touch panel may further include first transparent electrodes spaced apart from the transparent capping electrodes and covering the at least three intersection points between the plurality of first wirings and the plurality of second wirings in the first blocks, and second transparent electrodes covering at least three intersection points between the plurality of third wirings and the plurality of fourth wirings in the second blocks.

The first transparent electrodes may be connected to the plurality of first wirings and the plurality of second wirings, and the second transparent electrodes may be connected to the plurality of third wirings and the plurality of fourth wirings.

The first transparent electrodes may contact the plurality of first wirings and the plurality of second wirings, and the second transparent electrodes may contact the plurality of third wirings and the plurality of fourth wirings.

The plurality of first wirings, the plurality of second wirings, the plurality of third wirings, and the plurality of fourth wirings may be formed of a light-shielding metal.

In another aspect of the present invention, an organic light emitting display device includes the above-described flexible touch panel, an opposite substrate located opposite the flexible base substrate, touch pad electrodes located at an edge of the flexible base substrate of the flexible touch panel, a thin film transistor array and an organic light emitting diode array located on the opposite substrate so as to be opposite the first and second block arrays, touch assistant electrodes located on the opposite substrate so as to be opposite the touch pad electrodes, an anisotropic conductive film provided between the touch pad electrodes and the touch assistant electrodes and including conductive balls, and an adhesive layer filling a space between the organic light emitting diode array and the first and second block arrays of the flexible touch panel.

It is to be understood that both the foregoing general description and the following detailed description of the present invention are by example and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
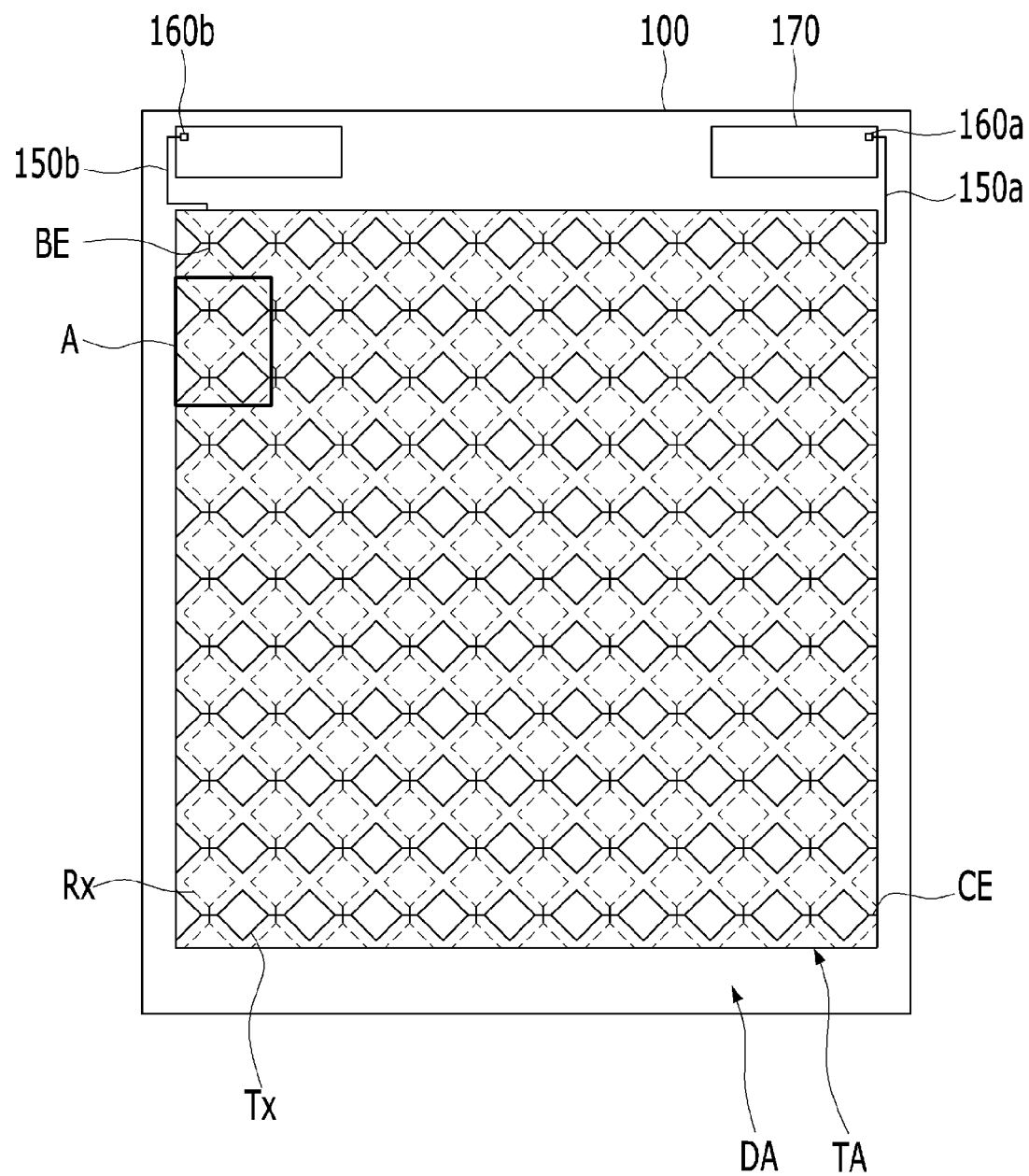
FIG. 1 is a plan view of a flexible touch panel according to an embodiment of the present invention.

Reference will now be made in detail to the embodiments of the present invention, examples of which are illustrated in the accompanying drawings. However, the disclosure of the invention is not limited to the embodiments set forth therein and may be variously modified. It should be understood, however, that there is no intent to limit the invention to the particular forms disclosed, but on the contrary, the invention is to cover all modifications, equivalents, and alternatives falling within the spirit and scope of the invention as defined by the claims.

Shapes, sizes, rates, angles, numbers, etc. illustrated in the drawings to describe the embodiments of the present invention are by example and thus are not limited to the drawings. In the drawings, the same or similar elements are denoted by the same reference numerals even though they are depicted in different drawings. In addition, in the following description of the present invention, a detailed description of known functions and configurations incorporated herein will be omitted when it may make the subject matter of the present invention rather unclear. In the following description of the embodiments, the terms "including", "having", "consisting of", etc. will be interpreted as indicating the presence of other elements, unless the term "only" is used. In addition, when a singular element is stated, the element may be provided in plural, unless stated otherwise.

In interpretation of elements included in the embodiments of the present invention, the elements will be interpreted as having error ranges, even if there is no clear statement to that effect.

It will be understood that when positional relations between two elements are described, for example, when an element is referred to as being "on", "above", "under" or "aside" another element, intervening elements may also be present between the two elements, unless the term "just" or "directly" is used.

Further, it will be understood that when temporal relations between incidents are described, for example, a temporal order, such as "after", "subsequent to", "next" or "before", is described, the incidents may not be continuous, unless the term "just" or "directly" is used.

It will be understood that, although the terms "first", "second", etc. may be used herein to describe various elements, these terms are used only to discriminate similar elements from one another. Therefore, in the following description of the embodiments, an element modified by the term "first" may be the same as an element modified by the term "second", unless stated otherwise.

Respective characteristics of the embodiments of the present invention may be partially or generally combined or mixed, or be technically variously interlocked and driven, and the embodiments may be independently executed or be executed together in connection with each other.

FIG. 1 is a plan view of a flexible touch panel according to an embodiment of the present invention.

As by example shown in FIG. 1, the flexible touch panel according to an embodiment of the present invention includes a plurality of transmission units Tx and a plurality of reception units Rx arranged in directions intersecting each other on a first base substrate 100 so as to detect touch.

Although the drawings illustrate the arrangement directions of the transmission units Tx and the reception units Rx as being the horizontal direction and the vertical direction, the disclosure is not limited thereto, and the arrangement directions of the transmission units Tx and the reception units Rx may be directions inclined at designated angles from the horizontal direction or be set to be the vertical direction and the horizontal direction.

Each of the transmission units Tx and the reception units Rx includes a plurality of blocks having a mesh structure including fine wirings intersecting each other, and having similar areas or an equal area in respective rows or columns.

The transmission units Tx and the reception units Rx of the touch panel including a plurality of first touch wirings 120 and a plurality of second touch wirings 130 having a mesh structure transmission units Tx and the reception units Rx to increase sensitivity in signal transmission and signal detection using a metal having low resistance without RC delay, to finely divide metal wirings so as to prevent the metal wirings from being visible through a screen, and to distribute stress caused by folding or bending when the flexible touch panel is used in a flexible organic light emitting display device.

The metal forming the first touch wirings 120 and the second touch wirings 130 is a metal having low resistance, for example, one selected from the group consisting of gold (Au), silver (Ag), palladium (Pd), copper (Cu), aluminum (Al), chrome (Cr), molybdenum (Mo) and titanium (Ti), or a metal laminate or an alloy including at least one thereof. For example, the metal laminate may be an Ag—Pd—Cu alloy (APC) or Mo—Al—Mo. However, the first and second touch wirings 120 and 130 are not limited thereto and may be formed of other metals having low resistance, alloys of these metals, or laminates including these metals.

A signal is sequentially transmitted to the rows of the transmission units Tx, and signal detection from the respective columns of the reception units Rx is sequentially executed. In this instance, if touch occurs, signal change is detected and, thus, whether or not touch occurs is judged by detecting the signal change by the reception units Rx.

The flexible touch panel according to an embodiment of the present invention has a touch electrode array including the transmission units Tx and the reception units Rx on the flexible first base substrate 100. The flexible touch panel is bonded to an organic light emitting diode array and thus has a function of inputting and detecting coordinates when an organic light emitting display device is operated.

The first base substrate 100 may be a thin base substrate formed of plastic, glass or metal. A first inorganic buffer film 105 (with reference to FIGS. 6A and 6B) is provided on the surface of the first base substrate 100 and may thus level a film formation surface of the first base substrate 100 on which the transmission units Tx and the reception units Rx are formed, thereby being capable of protecting a sacrificial layer under the first base substrate 100 for flexibility or the touch electrode array when a glass substrate is removed.

The first base substrate 100 includes a touch area TA provided at the central portion or a middle portion thereof and including the transmission units Tx and the reception units Rx arranged in a matrix, a dead area DA provided outside or a periphery of the touch area TA, touch pad parts 170 in some regions of the dead area DA, and routing wirings 150*a* and 150*b* connecting ends of the transmission units Tx and the reception units Rx to the touch pad parts 170. The routing wirings 150*a* and 150*b* may be formed in the same layer as the above-described first and second touch wirings 120 and 130 or in the same layer as the bridge electrodes 140.

The dead area DA corresponds to an area outside the touch area TA and includes regions corresponding to some widths of four sides of the first base substrate 100. A part of the dead area DA located at the side of the first base substrate 100, where the touch pad parts 170 are located, may occupy a relatively large area when compared to the active area AA, for example.

Although the drawings by example illustrate two touch pad parts 170 provided at both sides of the upper side of the first base substrate 100, the disclosure is not limited thereto and one touch pad part 170 may be provided at the center of the upper side of the first base substrate 100. Further, the touch pad parts 170 include a plurality of touch pad electrodes 160*a* and 160*b*, which are respectively connected to the routing wirings 150*a* and 150*b* connected to the transmission units Tx and the reception units Rx.

Further, in an organic light emitting display device according to an embodiment of the present invention, the touch pad parts 170 are connected to dummy pad parts of an organic light emitting diode (OLED) array and a thin film transistor (TFT) array by an anisotropic conductive film when the OLED array and a touch electrode array are bonded. Therefore, the touch pad electrodes 160*a* and 160*b* of the touch pad parts 170 are electrically connected to touch assistant electrodes 217 therebelow and may thus receive an electrical signal from the touch assistant electrodes 217 or transmit an electrical signal to the touch assistant electrodes 217. In this instance, the touch assistant electrodes 217 are controlled by a driving circuit substrate which drives the TFT array.

In FIG. 1, bridge parts BE connect unit blocks of the reception units Rx, and connection parts CE connect unit blocks of the transmission units Tx. The connection parts CE may be wirings formed integrally with mesh structures of the respective blocks of the transmission units Tx in the same layer as the mesh structures so as to connect the neighboring transmission units Tx, and the bridges parts BE may include a designated connector provided on the unit blocks of the neighboring reception units Rx and bridge electrodes formed in a different layer as the mesh structures of the reception units Rx. On the contrary, the bridge parts BE may be provided on the transmission units Tx and the connection parts CE may be provided on the reception units Rx. This will be described in detail later.

Figure 2A:
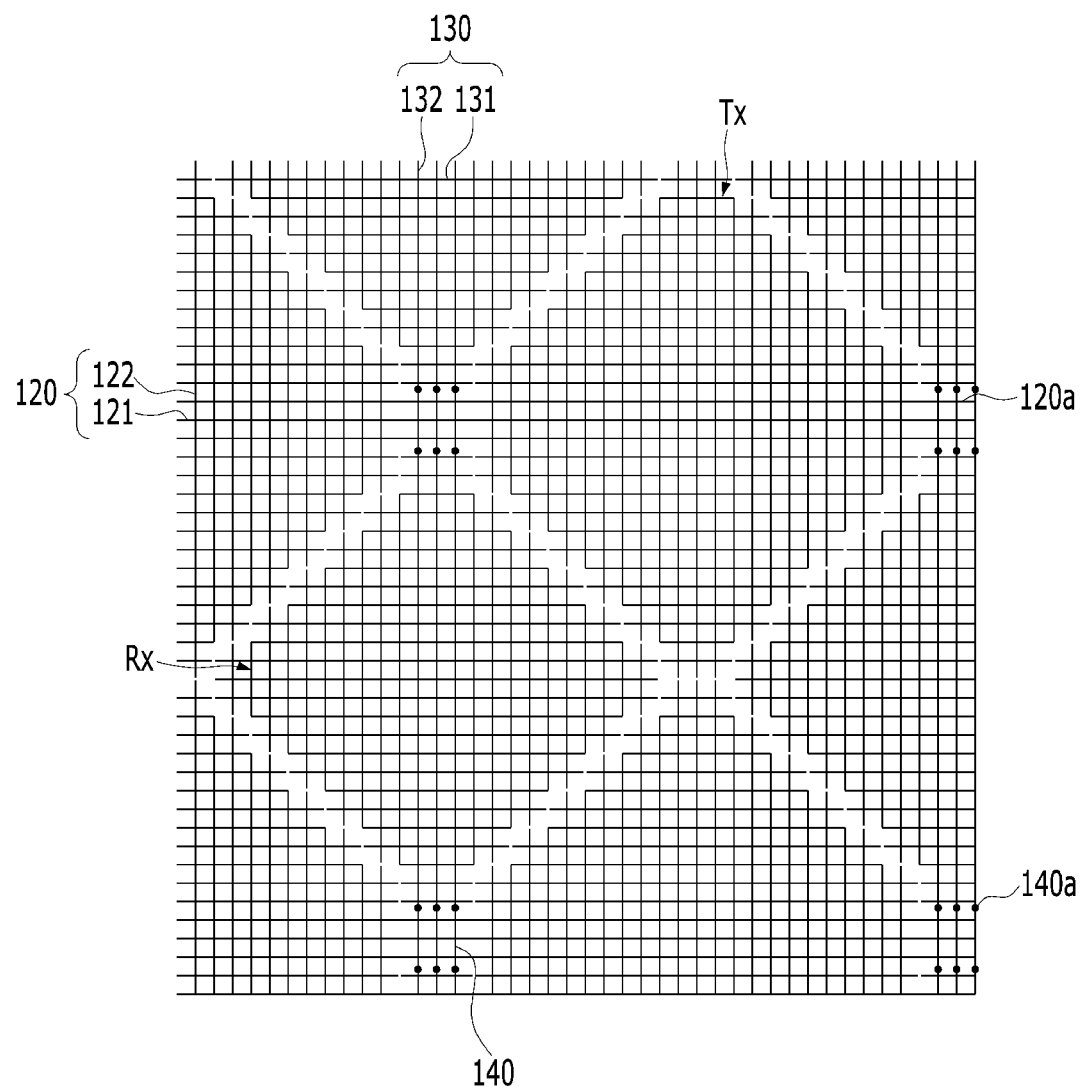
FIG. 2A is an enlarged plan view of region A of FIG. 1, illustrating a first type of the flexible touch panel according to an embodiment of the present invention.

FIG. 2A is an enlarged plan view of region A of FIG. 1, illustrating a first type of the flexible touch panel according to an embodiment of the present invention.

As by example shown in FIG. 2A, in the flexible touch panel according to an embodiment of the present invention, the first touch wirings 120 included in the transmission units Tx and the second touch wirings 130 included in the reception units Rx may be formed of a metal in the same layer. In this instance, at intersections at which the transmission units Tx arranged in the X direction and the reception units Rx arranged in the Y direction intersect each other, in order to prevent electrical short circuit between the first and second touch wirings 120 and 130, only one of the first and second touch wirings 120 and 130 extend to pass through the intersections, and the other of the first and second touch wirings 120 and 130 do not extend and are electrically isolated from each other through the bridge electrodes of a different layer. As by example shown in FIG. 2A, connection electrodes 120*a* formed integrally with first wirings 121 of the transmission units Tx are provided at the intersections integrally with the neighboring transmission units Tx so as to connect the neighboring transmission units Tx, and the bridge electrodes 140 intersecting or overlapping the connection electrodes 120a and provided in a different layer from the connection electrodes 120a are connected to third wirings 131 or fourth wirings 132 of the neighboring reception units Rx. Further, Although this figure illustrates a plurality of connection electrodes 120a spaced apart from one another in one direction as being provided at the intersection, one connection electrode may be provided at the intersection. The respective connection electrodes 120a are connected to the first touch wirings 120 of the neighboring transmission units Tx.

Otherwise, as another example, if the first touch wirings 120 and the second touch wirings 130 forming the transmission units Tx and the reception units Rx are formed of metals in different layers, even if bridge electrodes are not provided in a separate layer, the first touch wirings 120 and the second touch wirings 130 may respectively extend at the intersections and thus connect the neighboring transmission units Tx and connect the neighboring reception units Rx.

In this instance, the transmission unit Tx is a kind of block and includes a plurality of first touch wirings 120 including first wirings 121 arranged in a first direction and second wirings 122 arranged in a second direction differing from the first direction. The first and second wirings 121 and 122, which are integral wirings, are not spaced apart from each other. The first and second wirings 121 and 122 do not branch off into a mesh type about the intersection in the same layer. The first touch wirings 120 have a narrow width and are formed in a mesh shape in a region of the transmission unit Tx, as seen from above. In the same manner, the reception unit Rx includes a plurality of second touch wirings 130 including third wirings 131 arranged in a third direction and fourth wirings 132 arranged in a fourth direction differing from the third direction, the third and fourth wirings 131 and 132 being formed in a mesh shape. As by example shown in FIG. 2A, the third direction may be equal to the first direction and the fourth direction may be equal to the second direction. However, the disclosure is not limited thereto and the third and fourth directions of the second touch wirings 130 may be set to be different from the first and second directions of the first touch wirings 120. Further, the first and second direction may be perpendicular to each other, as by example shown in FIG. 2A, but the disclosure is not limited thereto and an angle therebetween may be an acute angle or an obtuse angle.

The above-described first type of the flexible touch panel according to an embodiment of the present invention, in which the first and second touch wirings 120 and 130 sensing touch are finely divided from each other, may distribute force, as compared to a structure in which large-area touch electrodes including transmission units Tx and reception units Rx as a block unit are formed, thus being relatively favorable to a flexible structure. However, since fine touch wirings are formed, the line width of the first and second touch wirings 120 and 130 is smaller than a touch area of a human hand or a stylus, and it may be difficult to sense change in capacitance during a touch as a result.

Figure 2B:
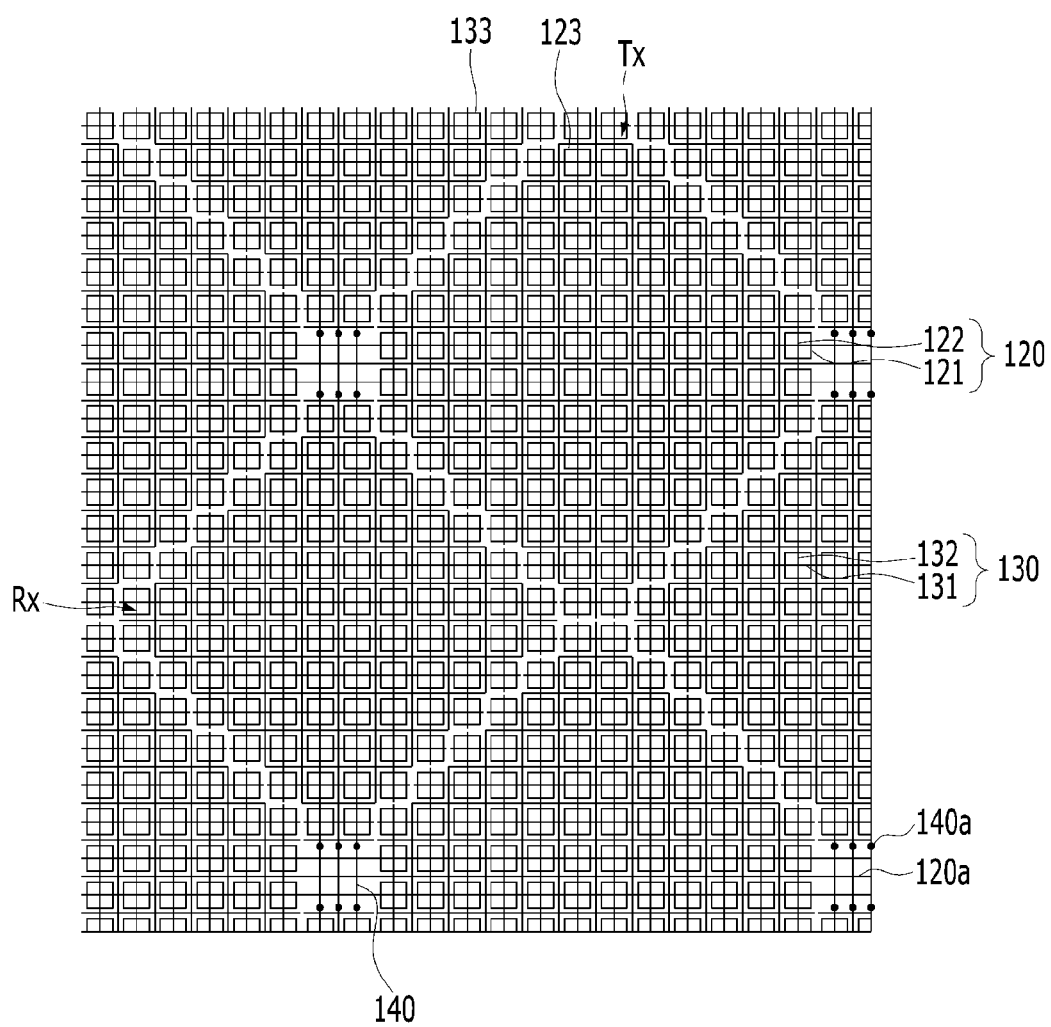
FIG. 2B is a plan view by example illustrating application of a transparent capping film to the first type of the flexible touch panel in accordance with a first comparative example.

FIG. 2B is a plan view by example illustrating application of a transparent capping film to the first type of the flexible touch panel in accordance with a first comparative example.

In the first comparative example shown in FIG. 2B, transparent electrodes 123 and 133 may be provided at intersection points between first and second wirings 121 and 122 of the first touch wirings 120 and intersection points between third and fourth wirings 131 and 132 of the second touch wirings 130.

The touch panel in accordance with the first comparative example is designed to improve touch sensitivity of the touch panel shown in FIG. 2A, and includes island-type first and second transparent electrodes 123 and 133. The first and second transparent electrodes 123 and 133 are provided at intersections of the first and second directions and intersections of the third and fourth directions of the touch wirings 120 and 130 in the respective blocks of the transmission units Tx and the reception units Rx. The island-type first and second transparent electrodes 123 and 133 are electrically connected to the first and second touch wirings 120 and 130.

The first and second transparent electrodes 123 and 133 are formed of a material, such as indium tin oxide (ITO), indium zinc oxide (IZO) or indium gallium zinc oxide (IGZO).

The first and second touch wirings 120 and 130 are formed of a metal having low resistance and thus the first and second touch wirings 120 and 130 may reduce line resistance and RC delay. However, since dimensions of a region occupied by the touch wirings in a touch area, in which touch substantially occurs, are small, capacitance change of a touch object in the touch area is small and thus it may be difficult to detect whether or not touch occurs. Therefore, the reason why the first and second transparent electrodes 123 and 133 are provided is that the first and second touch wirings 120 and 130 have a small line width and thus capacitance change due to a touch object (a finger or a stylus) may be easily detected by increasing dimensions of a region occupied by electrodes in the touch panel. That is, the first and second transparent electrodes 123 and 133 having horizontal and vertical widths greater than the line width of the touch wirings 120 and 130 so as to cover the intersections of the touch wirings 120 and 130 are provided. Although the illustrated first and second transparent electrodes 123 and 133 have a rectangular shape, the disclosure is not limited thereto and the first and second transparent electrodes 123 and 133 may have other shapes, such as a polygonal shape, a rounded shape or a combination of different shapes.

Therefore, when a user contacts the touch panel with a finger or a stylus, the reception unit Rx detects signal change due to capacitance generated between the finger and the second touch wirings 130 and second transparent electrode 133 in the reception unit Rx, thus stably detecting whether or not touch occurs.

Other configurations of the touch panel in accordance with the first comparative example are the same as those of the first type of the touch panel of shown in FIG. 1 except that that the touch panel in accordance with the first comparative example includes the transparent electrodes 123 and 133.

The island-type transparent electrodes 123 and 133 are spaced apart from one another on a plane and are thus also referred to as segment electrodes.

Further, although the transmission units Tx and the reception units Rx include the first touch wirings 120 arranged in the first and second directions differing from each other and the second touch wirings 130 arranged in the third and fourth directions differing from each other, the transmission units Tx and the reception units Rx may further include wirings arranged in other directions between two directions in addition to the wirings arranged in the two directions.

Figure 3:
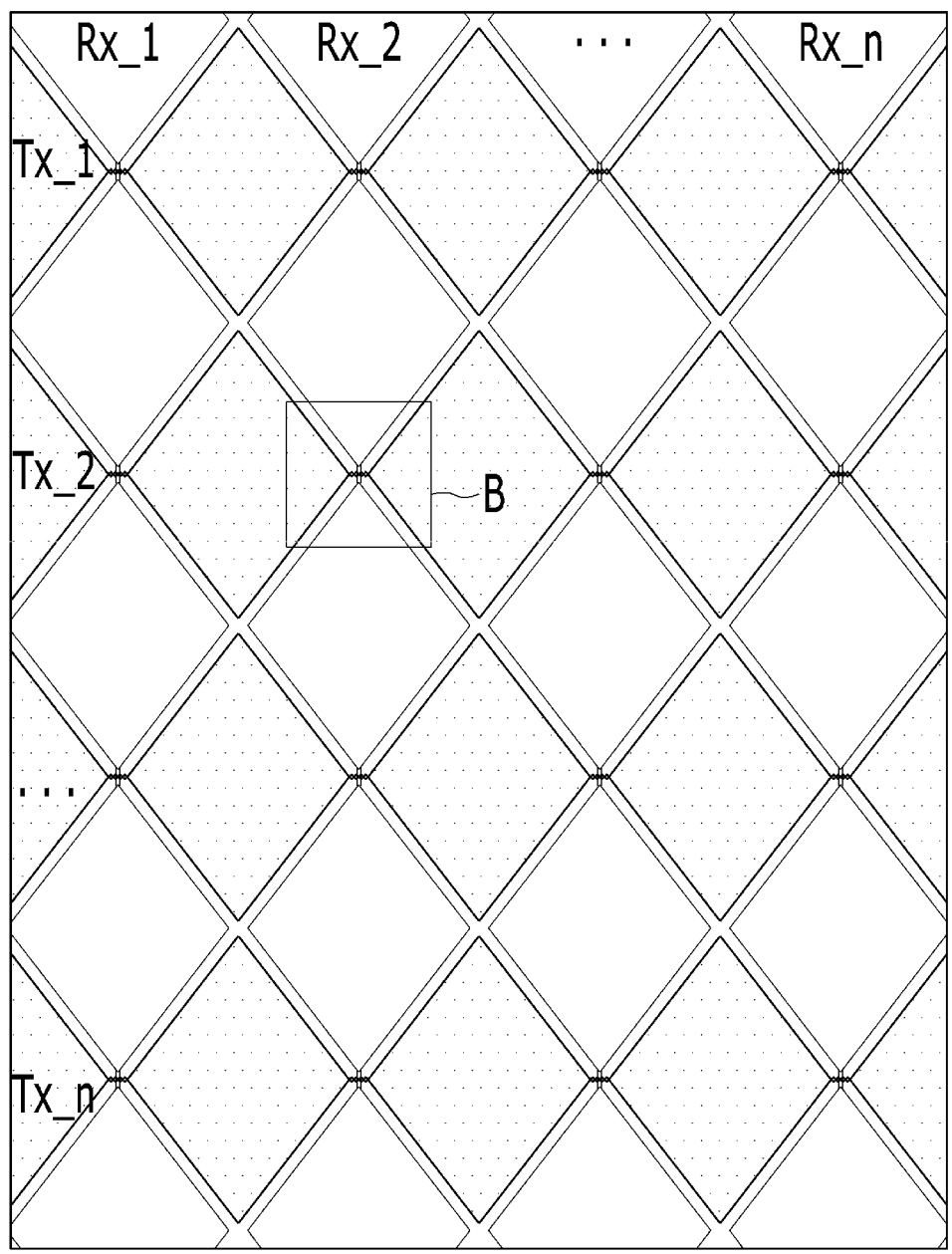
FIG. 3 is an enlarged plan view of an active area, illustrating a second type example of the flexible touch panel according to an embodiment of the present invention.

FIG. 3 is an enlarged plan view of an active area, illustrating a second type of the flexible touch panel according to an embodiment of the present invention.

As by example shown in FIG. 3, in the second type of the flexible touch panel according to an embodiment of the present invention, connection parts formed integrally with touch wirings of blocks of reception units Rx are provided between the reception units Rx, and bridge electrodes formed in a layer different from the layer of touch wirings of blocks of transmission units Tx are provided between the transmission units Tx.

That is, the second type of the flexible touch panel according to an embodiment of the present invention has the positional relations of the connection parts and the bridge electrodes, which is opposite to the positional relations in the above-described first type of the flexible touch panel. Further, the second type of the flexible touch panel differs from the first type of the flexible touch panel in that the respective blocks in the transmission units Tx and the reception units Rx include touch wirings arranged in a diagonal direction tilted from the first direction and in a diagonal direction tilted from the second direction, instead of the touch wirings arranged in the vertical direction and in the horizontal direction shown in FIG. 2A so as to intersect each other.

Now, a flexible touch panel in accordance with a second comparative example will be described.

Figure 4A:
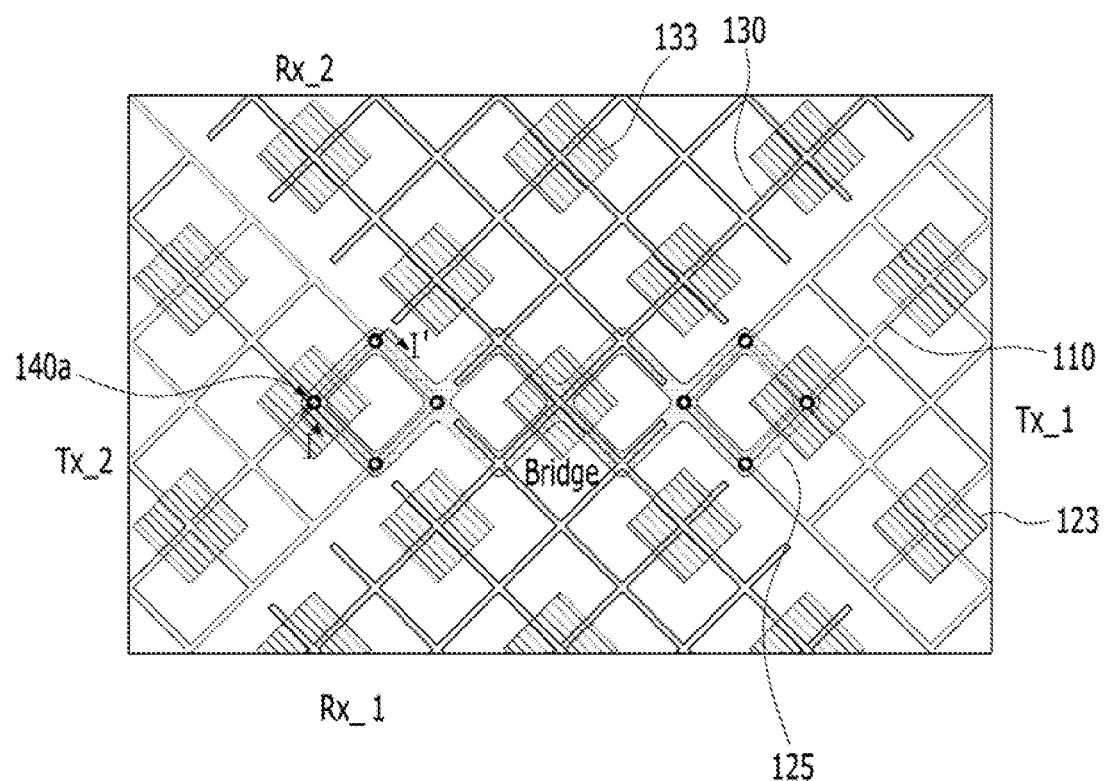
FIG. 4A is a plan view illustrating region B of FIG. 3 in accordance with a second comparative example.
Figure 4B:
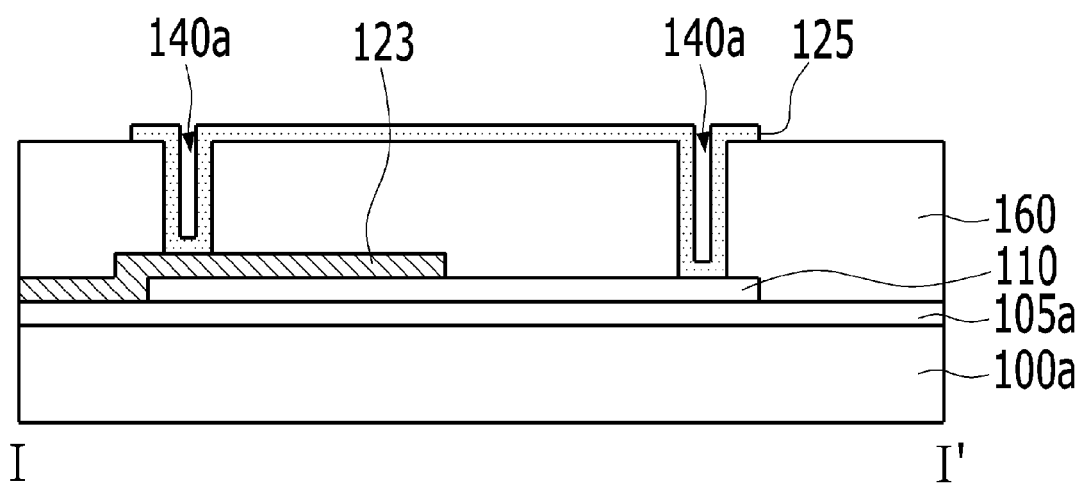
FIG. 4B is a cross-sectional view taken along line I-I' of FIG. 4A.

FIG. 4A is a plan view illustrating region B of FIG. 3 in accordance with the second comparative example, and FIG. 4B is a cross-sectional view taken along line I-I' of FIG. 4A.

As by example shown in FIGS. 4A and 4B, the flexible touch panel in accordance with the second comparative example includes first and second transparent electrodes 123 and 133 at each intersection of first and second touch wirings 110 and 130 of transmission units Tx and reception units Rx, and in one embodiment, and the size of the first and second transparent electrodes 123 and 133 can be designed as the size of a rectangular area defined as an intersection between two wirings arranged in different directions.

Therefore, the first transparent electrode 123 has a connection hole 140a with a bridge electrode 125 in only one of respective unit blocks Tx_1, Tx_2, . . . , and is limited to a rectangular area defined as an intersection between the first touch wirings 110 which are substantially spaced apart from each other, or an intersection between the second touch wirings 130 which are substantially spaced apart from each other.

In this instance, in the flexible touch panel in accordance with the second comparative example, an inorganic buffer layer 105a is formed on a substrate 100a, the first touch wirings 110 are formed thereon, and the first transparent electrodes 123 covering parts of the first touch wirings 110 are respectively provided at the edges of the unit blocks of the adjacent transmission units Tx. Further, a connection hole 140a is provided at a part of an overlapping region between the first transparent electrode 123 and the first touch wiring 110, and the bridge electrode 125 is formed through the connection hole 140a and is thus connected to the transparent electrode 123. An interlayer insulating film 160 may be provided in an interlayer between the first transparent electrode 123 and the bridge electrode 125 except for the connection hole 140a.

If the bridge electrode 125 is connected to one connection hole 140a formed at each of both edges of connection parts of the bridge electrode 125, there is a high possibility that the bridge electrode 125 vulnerable to folding will crack. The bridge electrodes 125 serve to electrically (conductively) connect the first touch wirings 110 spaced apart from each other through some connection holes 140a and, if external physical force, such as folding, is applied, the connection holes 140a may crack and thus electrically open and detection of touch in the electrically open region may be difficult.

Hereinafter, a flexible touch panel, which solves the above-described problems of the comparative examples, and an inorganic light emitting display device using the same will be described.

A flexible touch panel according to one embodiment of the present invention is configured as follows.

Figure 5:
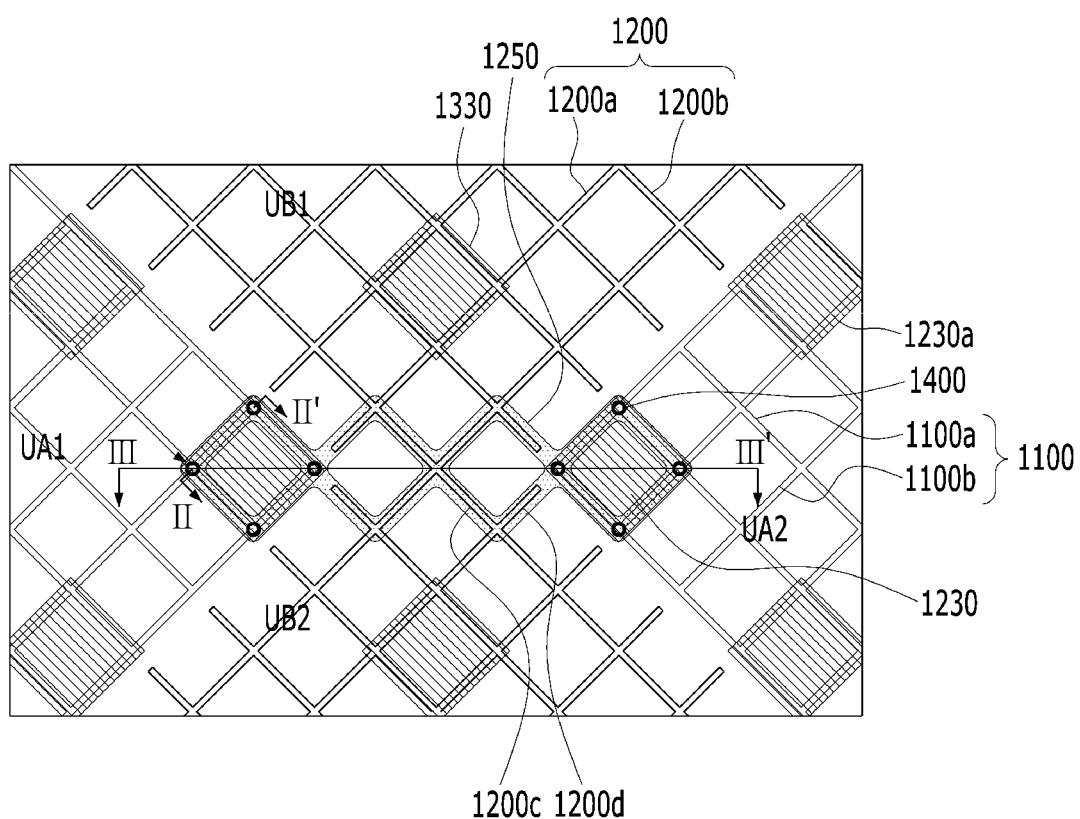
FIG. 5 is an enlarged plan view of a flexible touch panel according to one embodiment of the present invention in region B of FIG. 3.
Figure 6A:
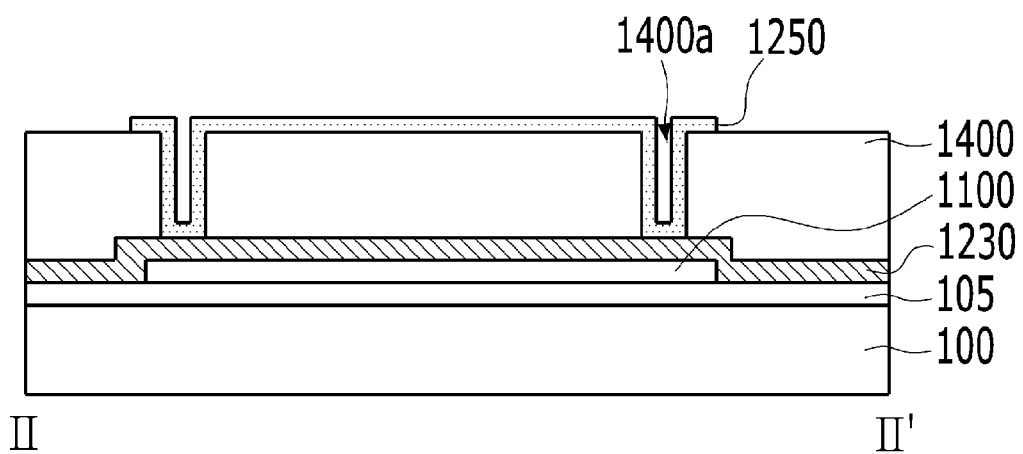
FIGS. 6A and 6B are cross-sectional views taken along line II-II' and line III-III' of FIG. 5, respectively.
Figure 6B:
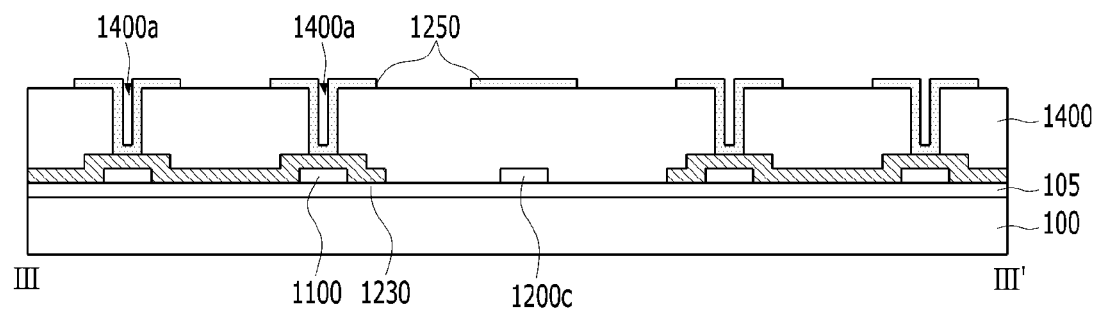

FIG. 5 is an enlarged plan view of a flexible touch panel according to one embodiment of the present invention in region B of FIG. 3, and FIGS. 6A and 6B are cross-sectional views taken along line II-II' and line III-III' of FIG. 5.

As by example shown in FIGS. 5 to 6B, a flexible touch panel according to an embodiment of the present invention may include a flexible base substrate 100, a first block array including a plurality of first blocks UA1, UA2, . . . formed by intersection between a plurality of first wirings 1100a and a plurality second wirings 1100b arranged in different directions on the flexible base substrate 100 and disposed in a first direction so as to be spaced apart from each other, a second block array including a plurality of second blocks UB1, UB2, . . . formed by intersection between a plurality of third wirings 1200a and a plurality fourth wirings 1200b arranged in different directions on the flexible base substrate 100 and disposed in a second direction, bridge electrodes 1250 overlapping the first wirings 1100a and the second wirings 1100b at facing parts of the adjacent first blocks UA1 and UA2 of the first block array, connection electrodes formed in the same layer as the third wirings 1200a and the fourth wirings 1200b and connected integrally with the third wirings 1200a and the fourth wirings 1200b of the adjacent second blocks UB1 and UB2, and transparent capping electrodes 1230 including at least three intersection points between the first wirings 1100a and the second wirings 1100b in each of the adjacent first blocks UA1 and UA2 of the first block array and overlapping the bridge electrodes 1250.

In this instance, although the first blocks UA1, UA2, . . . are illustrated as the transmission units Tx of FIG. 3 and the second blocks UB1, UB2, . . . are illustrated as the reception units Rx of FIG. 3, the disclosure is not limited thereto but the first blocks UA1, UA2, . . . may be the reception units Rx and the second blocks UB1, UB2, . . . may be the transmission units Tx. That is, elements including bridge electrodes may be reception units Rx.

Further, first touch wirings 1100 include the first wirings 1100a and the second wirings 1100b, and the first wirings 1100a and the second wirings 1100b are patterns formed of the same metal and branched off into a mesh type within the first blocks UA1, UA2, . . . .

In the same manner, second touch wirings 1200 include the third wirings 1200a and the fourth wirings 1200b, and the third wirings 1200a and the fourth wirings 1200b are patterns formed of the same metal as the first touch wirings 1100 and branched off into a mesh type within the second blocks UB1, UB2, . . . .

In regions where the transparent capping electrodes 1230 are located, contact holes 1400a may be formed at the at least three intersection points between the bridge electrodes 1250 and the first and second wirings 1100a and 1100b, and the bridge electrodes 1250 may be electrically connected to the intersection points with the first and second wirings 1100a and 1100b.

The transparent capping electrodes 1230 may have a shape which covers a single rectangular area formed by intersection of two first wirings 1100a and two second wirings 1100b in each of the first blocks UB1, UB2, . . . , as by example shown in FIG. 5. That is, regions of the transparent capping electrodes 12, which are electrically connected to the bridge electrodes 1250, cover the intersections between the first wirings 1100a and the second wirings 1100b, spaced apart from each other, in a diagonal direction and, thus, durability of the weak bridge electrodes 1250 may be improved.

Therefore, even if some cracks of the bridge electrodes 1250 occur in the connection regions between the transparent capping electrodes 1230 and the bridge electrodes 1250 due to folding, an electrical signal is transmitted to the broad transparent capping electrodes 1230 formed under the bridge electrodes 1250 and lowering of reliability in touch detection is eliminated. That is, reliability of the device may be improved.

In the second block array provided with no bridge electrodes 1250, the connection electrodes may be located in separation regions between the adjacent second blocks UB1 and UB2. In this instance, the connection electrodes may include first connection wirings 1200c and second connection wirings 1200d intersecting each other in the same shape as the intersecting shape between the third wirings 1200a and the fourth wirings 1200b. In this instance, the bridge electrodes 1250 overlap the first connection wirings 1200c and the second connection wirings 1200d.

Further, an interlayer insulating film 1400 is provided in an interlayer between the first and second connection wirings 1200c and 1200d and the bridge electrodes 1250.

The flexible display panel may further include first transparent electrodes 1230a spaced apart from the transparent capping electrodes 1230 and covering at least three intersection points between the first wirings 1100a and the second wirings 1100b in the first blocks UA1 and UA2, and second transparent electrodes 1330 covering at least three intersection points between the third wirings 1200a and the fourth wirings 1200b in the second blocks UB1 and UB2.

In this instance, the first transparent electrodes 1230a, the second transparent electrodes 1330 and the transparent capping electrodes 1230 are located in the same layer.

Further, the first transparent electrodes 1230a may be connected to the first wirings 1100a and the second wirings 1100b, and the second transparent electrodes 1330 may be connected to the third wirings 1200a and the fourth wirings 1200b. The first transparent electrodes 1230a and the first and second wirings 1100a and 1100b contact each other and the second transparent electrodes 1330 and the third and fourth wirings 1200a and 1200b contact each other and, thus, not only the bridge electrodes 1250 but also the connection areas between the first touch wirings 1100 and the first transparent electrodes 1230a and the connection areas between the second touch wirings 1200 and the second transparent electrodes 1330 in the respective blocks are wide and cracks in the corresponding areas during folding may be prevented.

The first, second, third and fourth wirings 1100a, 1100b, 1200a and 1200b serving as touch wirings, and the first and second connection wirings 1200c and 1200d may be formed of a light-shielding metal. For example, the first touch wirings 1100 and the second touch wirings 1200 may be formed of a metal having low resistance, for example, one selected from the group consisting of gold (Au), silver (Ag), palladium (Pd), copper (Cu), aluminum (Al), chrome (Cr), molybdenum (Mo) and titanium (Ti), or a metal laminate or an alloy including at least one thereof. For example, the metal laminate may be an Ag—Pd—Cu alloy (APC) or Mo—Al—Mo. However, the first and second touch wirings 1100 and 1200 are not limited thereto and may be formed of other metals having low resistance, alloys of these metals, or laminates including these metals. The first to fourth wirings 1100, 1100b, 1200a and 1200b are main elements to transmit electrical signals and may thus be formed of a metal having low resistance.

Further, the transparent capping electrodes 1230 and the first and second transparent electrodes 1230a and 1330 are formed of a material, such as indium tin oxide (ITO), indium zinc oxide (IZO) or indium gallium zinc oxide (IGZO). Since the areas occupied by these electrodes 1230, 1230a and 1330 are relatively broad, the electrodes 1230, 1230a and 1330 are formed of a transparent material so as to prevent lowering of visibility. The transparent capping electrodes 1230 and the first and second transparent electrodes 1230a and 1330 may have the same shape and size. The reason for this is to prevent lowering of visibility, such as reflection or moiré generated if the electrodes 1230, 1230a and 1330 formed of a transparent material are viewed obliquely in a designated direction. That is, uniformity is provided to pattern shapes, thus preventing a specific region from standing out.

Further, the bridge electrodes 1250 located on the transparent capping electrodes 1230 may include the same kind of low-resistance wirings as the above-described first to fourth wirings 1100a, 1100b, 1200a and 1200b.

As circumstances require, the order of the bridge electrodes 1250 and the transparent capping electrodes 1230 may be reversed. That is, the bridge electrodes 1250 directly contacting the first and second wirings 1100a and 1100b may be formed and, then, the transparent capping electrodes 1230 may be connected to the bridge electrodes 1250 by the first connection holes 1400a formed through the interlayer insulating film 1400 interposed between the bridge electrodes 1250 and the transparent capping electrodes 1230.

Figure 7:
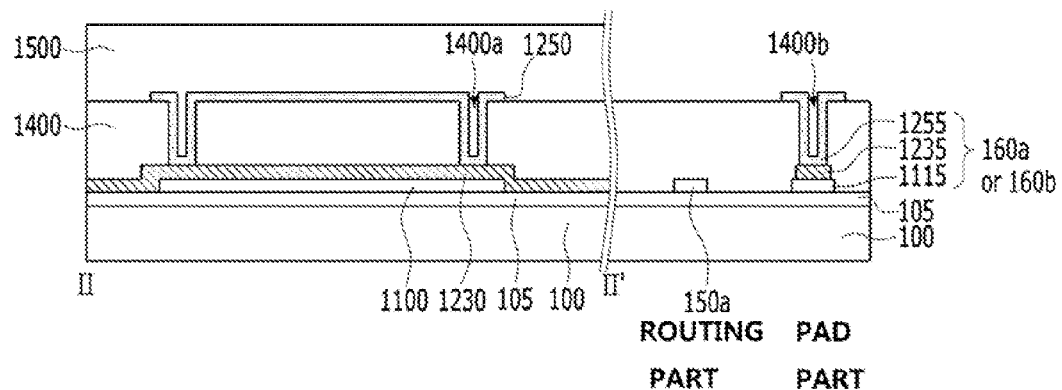
FIG. 7 is a cross-sectional view of a flexible touch panel according to another embodiment of the present invention.

FIG. 7 is a cross-sectional view of a flexible touch panel according to another embodiment of the present invention.

As by example shown in FIG. 7, the flexible touch panel according to this embodiment of the present invention further includes a touch protective film 1500 covering blocks, in addition to the elements of the above-described flexible touch panel according to an embodiment of the present invention.

The touch protective film 1500 may be located on routing wirings 150a or 150b located in a dead area D/A, as circumstances require.

The routing wirings 150a and pad electrodes 160a and 160b are formed together with formation of elements within the blocks. The routing wirings 150a are located in the same layer as first to fourth wirings 1100a, 1100b, 1200a and 1200b, and each of the pad electrodes 160a and 160b may include, for example, a stack of a first touch pad electrode 1115 formed of a metal having low resistance, a second touch pad electrode 1235 formed of a transparent electrode material, and a third touch pad electrode 1255 formed in the same layer as the bridge electrodes 1250.

In this instance, the third touch pad electrode 1255 may be connected to the second touch pad electrode 1235 through a second connection hole 1400b passing through an interlayer insulating film 1400.

In this instance, with reference to FIGS. 8A to 8I and the configuration shown in FIG. 7, a method of manufacturing a flexible touch panel according to an embodiment of the present invention will be described.

FIGS. 8A to 8I are cross-sectional views illustrating a method of manufacturing a flexible touch panel according to an embodiment of the present invention.

Figure 8A:
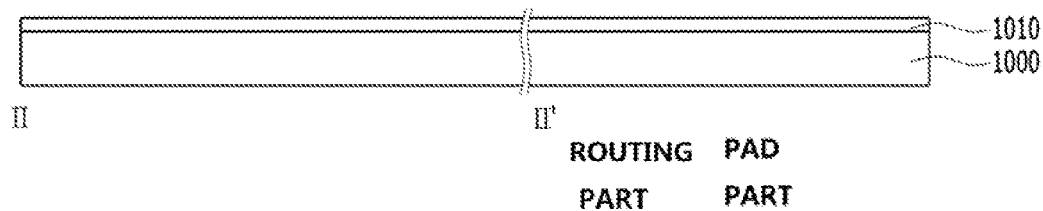
FIGS. 8A to 8I are cross-sectional views illustrating a method of manufacturing a flexible touch panel according to an embodiment of the present invention.

As by example shown in FIG. 8A, a first glass substrate 1000 is prepared and a first sacrificial layer 1010 is formed thereon. For example, the first sacrificial layer 1010 may be formed of amorphous silicon.

Figure 8B:
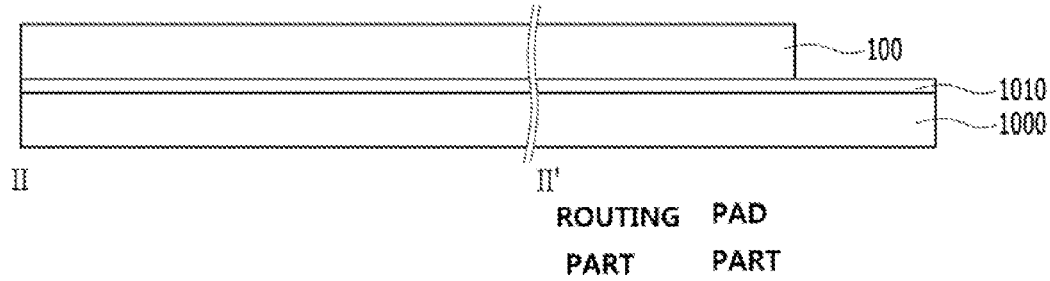

Thereafter, as by example shown in FIG. 8B, a flexible base substrate 100 is formed on the first sacrificial layer 1010. In this instance, the flexible base substrate 100 may be formed in some regions of the first sacrificial layer 1010 by patterning a thin transparent organic film formed of polyimide.

Figure 8C:
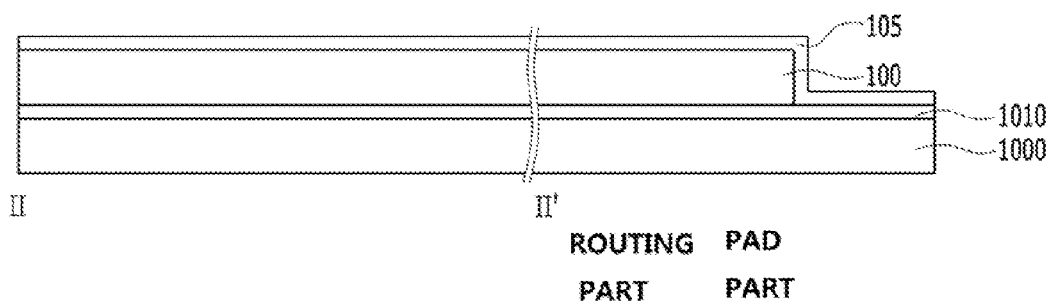

Thereafter, as by example shown in FIG. 8C, a first inorganic buffer film 105 covering the flexible base substrate 100 is formed on the first sacrificial layer 1010. The first inorganic buffer film 105 may be formed by alternately stacking a plurality of different inorganic films, and protects the flexible base substrate 100 formed under the first inorganic buffer film 105 during a process of forming a touch electrode array.

Figure 8D:
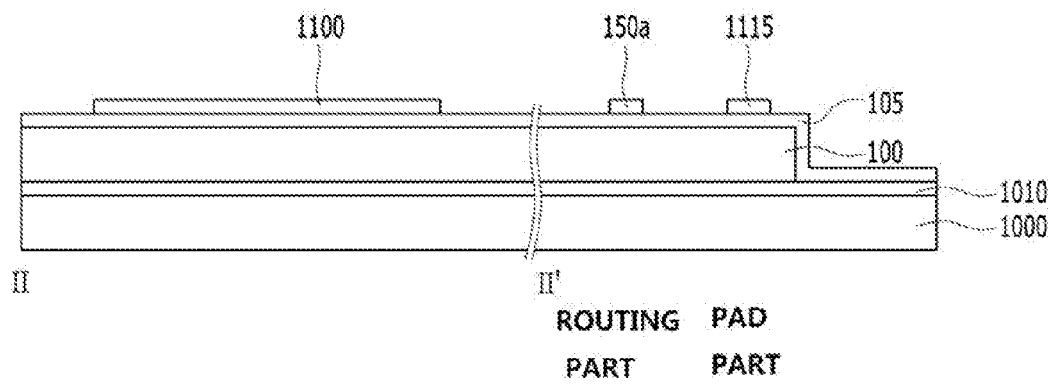

Thereafter, as by example shown in FIG. 8D, first and second touch wirings 1100 and 1200 having a mesh type, as by example shown in FIG. 5, are formed in first blocks UA1, UA2, . . . and second blocks UB1, UB2, . . . in a touch area TA (in FIG. 5) of the first inorganic buffer film 105, routing wirings 150a are formed at routing parts, and first touch pad electrodes 1115 are formed at pad parts.

In this instance, first and second connection wirings 1200c and 1200d connected to the third and fourth wirings 1200a and 1200b of the second blocks UB1, UB2, . . . are formed between the adjacent second blocks UB1 and UB2, thus integrally connecting the second blocks UB1 and UB2.

Figure 8E:
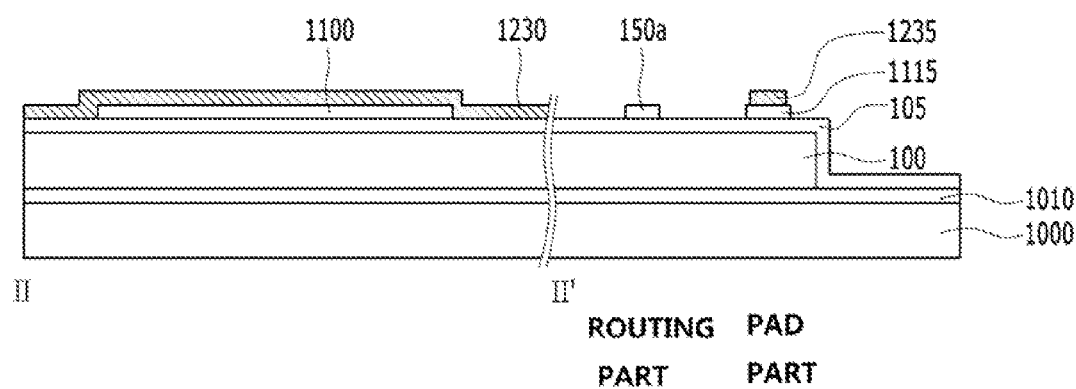

As by example shown in FIGS. 5 and 8E, transparent capping electrodes 1230 including at least three intersection points between the first wirings 1100a and the second wirings 1100b and thus covering the first touch wirings 1100 are formed at the edge of each of the adjacent first blocks UA1 and UA2, first transparent electrodes 1230a having the same shape as the transparent capping electrodes 1230 are formed in other regions of the first blocks UA1 and UA2, and second transparent electrodes 1330 are formed in other regions of the second blocks UB1 and UB2, simultaneously. Second touch pad electrodes 1235 are formed on the first touch pad electrodes 115 at the pad parts.

Figure 8F:
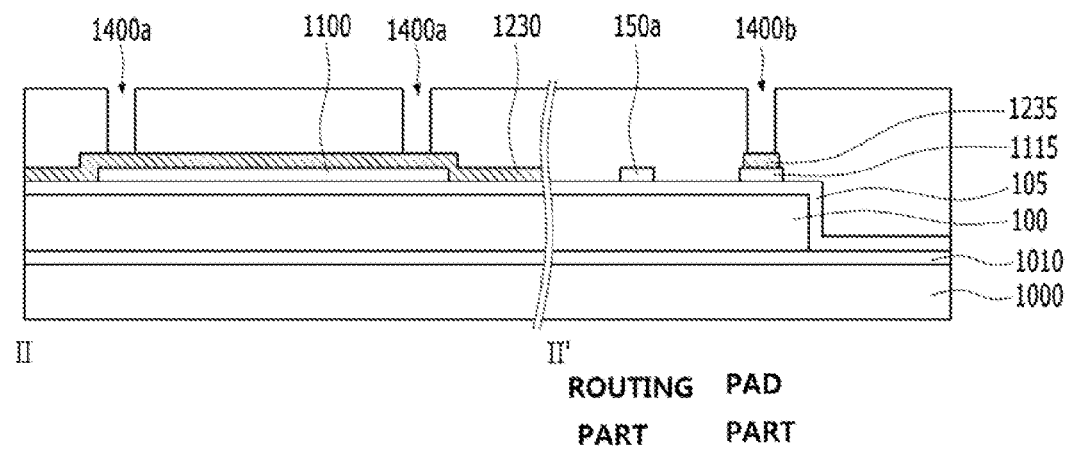

Thereafter, as by example shown in FIG. 8F, an interlayer insulating film 1400 is formed so as to cover the entire surface of the substrate 1000, first connection holes 1400a exposing three or more positions of the edge of the first transparent electrodes 1230a overlapping the first touch wirings 1100 are formed and, simultaneously, second connection holes 1400b exposing the second touch pad electrodes 1235 are formed.

Figure 8G:
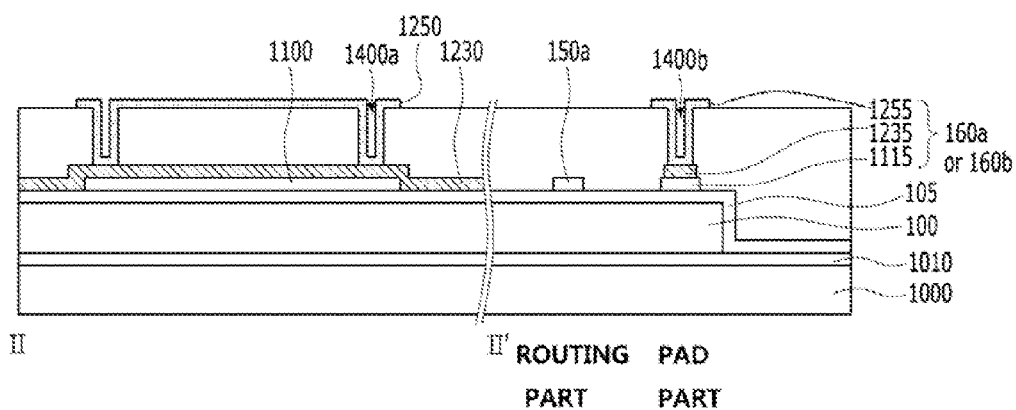

Thereafter, as by example shown in FIG. 8G, bridge electrodes 1250 connected to the transparent capping electrodes 1230 through the first connection holes 1400a are formed, and third touch pad electrodes 1255 connected to the second touch pad electrodes 1235 through the second connection holes 1400b are formed at the pad parts. In this instance, the first and third touch pad electrodes, 1115, 1235 and 1255, which are sequentially stacked, form the touch pad electrodes 160a or 160b.

Figure 8H:
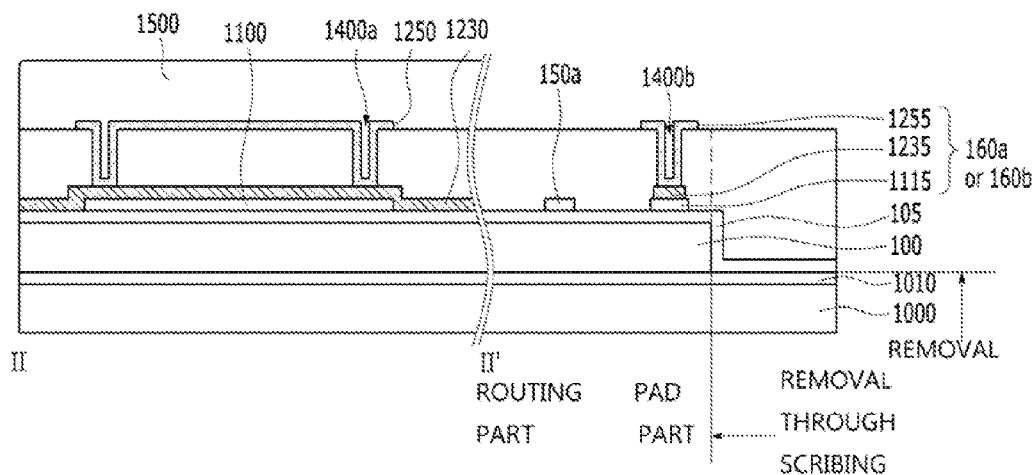

As by example shown in FIG. 8H, a touch protective film 1500 is formed on the interlayer insulating film 1400 in the touch area TA provided with the bridge electrodes 1250. Formation of the touch protective film 1500 may be selective.

Subsequently, the first substrate 1000 and the first sacrificial layer 1010 may be removed through laser irradiation or by etching, for the purpose of slimming of the device. When the first substrate 1000 and the first sacrificial layer 1010 are removed, the first sacrificial layer is used as a boundary and, in this instance, regions of the side surface in which the flexible base substrate is not located are removed. Such a removal process is carried out after the flexible touch panel is bonded to a lower array including a thin film transistor array and organic light emitting diodes, when an organic light emitting display device including the flexible touch panel is manufactured.

Figure 8I:
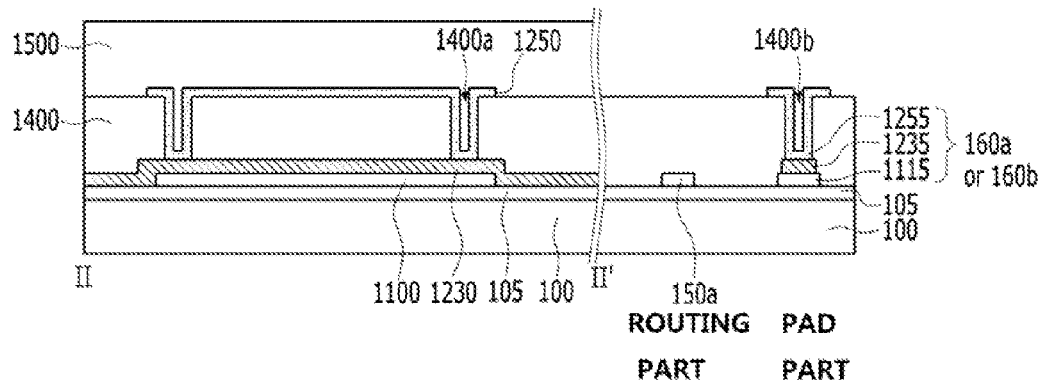

FIG. 8I illustrates a state in which the first glass substrate 1000, the first sacrificial layer 1010 and insulating films on the side surface of the flexible base substrate 100 are removed through scribing. Such a structure is defined after the flexible touch panel is bonded to the lower array.

Next, an organic light emitting display device according to an embodiment of the present invention will be described.

Figure 9:
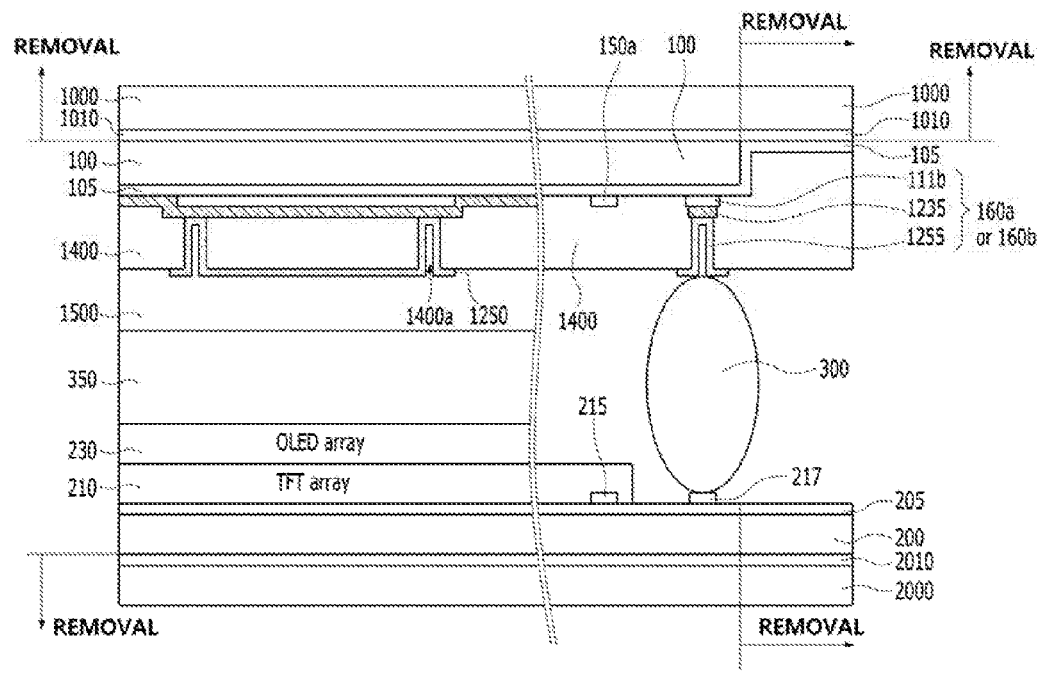
FIG. 9 is a cross-sectional view of an organic light emitting display device according to an embodiment of the present invention.

FIG. 9 is a cross-sectional view of an organic light emitting display device according to an embodiment of the present invention.

As by example shown in FIG. 9, the organic light emitting display device according to an embodiment of the present invention includes the flexible touch panel shown in FIG. 8H as an upper structure, and a lower array including a second glass substrate 2000, a second sacrificial layer 2010, an opposite flexible base substrate 200 and a second inorganic buffer film 205, which are sequentially stacked, and a thin film transistor (TFT) array 210 and an organic light emitting diode (OLED) array 230 provided on the second inorganic buffer film 205.

In this instance, the TFT array 210 includes a plurality of sub-pixels in a region thereof corresponding to the touch area TA, and each sub-pixel includes two or more thin film transistors and one or more capacitors. The thin film transistor may include a gate electrode, a semiconductor layer, a source electrode and a drain electrode.

Further, the OLED array 230 includes organic light emitting diodes, each of which is connected to one of the thin film transistors and is provided in each sub-pixel. The organic light emitting diode is formed by stacking a first electrode, an organic light emitting layer and a second electrode.

A protective film for preventing moisture permeation is provided on the OLED array 230 so as to cover both the upper and side surfaces of the second electrode.

Such a lower array and the flexible touch panel is bonded by an adhesive layer 350 provided in the touch area TA, the dead area DA of the flexible touch panel is provided with routing wirings 150a and touch pad electrodes 160a or 160b, and the dead array DA of the lower array is provided with array pad electrodes 215 and touch assistant electrodes 217. In this instance, the upper touch pad electrodes 160a or 160b are connected to the lower touch assistant electrodes 217 by an anisotropic conductive film including conductive balls 300.

The first glass substrate 1000, the first sacrificial layer 1010, the second glass substrate 2000 and the second sacrificial layer 2010 are sequentially removed through laser irradiation. Such a removal process is carried out after the upper flexible touch panel and the lower array are bonded, as by example shown in FIG. 9.

Further, the opposite flexible base substrate 200 may be a colored flexible base substrate, and the flexible base substrate 100 may be a transparent flexible base substrate. The reason for this is that display is executed through the upper surface of the organic light emitting display device and touch occurs on the display surface.

As apparent from the above description, a flexible touch panel and an organic light emitting display device using the same according to an embodiment of the present invention have effects below.

First, in a structure having mesh-type touch wirings, transparent capping electrodes having a large area sufficient to cover three or more connection parts are formed in regions where bridge electrodes connecting wirings spaced apart from each other are formed, and, thus, when the flexible touch panel is folded, cracks in the touch wirings in the connection parts may be prevented.

Second, even if a crack occurs in a touch wiring part close to a substrate when the flexible touch panel is folded, the broad transparent capping electrodes connected to the touch wirings are electrically connected to the bridge electrodes and thus prevent a defect in touch detection. Consequently, reliability of the flexible touch panel in touch detection may be improved.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A flexible touch panel comprising:
   a flexible base substrate;
   a first block array including a plurality of first blocks formed by a first intersection between a plurality of first wirings and a plurality second wirings on the flexible base substrate, each first block being spaced apart from one another in a first direction;
   a second block array including a plurality of second blocks formed by a second intersection between a plurality of third wirings and a plurality fourth wirings on the flexible base substrate, each second block being disposed in a second direction;
   bridge electrodes overlapping the plurality of first wirings and the plurality of second wirings at facing parts of adjacent first blocks of the first block array;
   connection electrodes in the same layer as the plurality of third wirings and the plurality of fourth wirings, and connected integrally with the plurality of third wirings and the plurality of fourth wirings of adjacent second blocks; and
   transparent capping electrodes including at least three intersection points between the plurality of first wirings and the plurality of second wirings in each of the adjacent first blocks of the first block array and overlapping the bridge electrodes.

2. The flexible touch panel according to claim 1, wherein, in regions of the flexible touch panel provided with the transparent capping electrodes, contact holes are formed at locations between the bridge electrodes and the at least three intersection points of the plurality of first wirings and the plurality of second wirings, and the bridge electrodes are connected to the at least three intersection points with the plurality of first wirings and the plurality of second wirings.

3. The flexible touch panel according to claim 1, wherein the transparent capping electrodes have a shape covering a single rectangular area formed by the first intersection of two first wirings and the second intersection of the two second wirings in each of the plurality of first blocks.

4. The flexible touch panel according to claim 1, wherein the connection electrodes are located in separation regions between the adjacent first blocks.

5. The flexible touch panel according to 4, wherein the connection electrodes include first connection wirings and second connection wirings intersecting each other in the same shape as an intersecting shape between the plurality of third wirings and the plurality of fourth wirings.

6. The flexible touch panel according to claim 5, wherein the bridge electrodes overlap the first connection wirings and the second connection wirings.

7. The flexible touch panel according to claim 6, wherein an interlayer insulating film is provided in between a layer of the first connection wirings and the second connection wirings and a layer of the bridge electrodes.

8. The flexible touch panel according to claim 1, further comprising:
   first transparent electrodes spaced apart from the transparent capping electrodes and covering the at least three intersection points between the plurality of first wirings and the plurality of second wirings in the first blocks; and
   second transparent electrodes covering at least three intersection points between the plurality of third wirings and the plurality of fourth wirings in the plurality of second blocks.

9. The flexible touch panel according to claim 8, wherein:
   the first transparent electrodes are connected to the plurality of first wirings and the plurality of second wirings; and
   the second transparent electrodes are connected to the plurality of third wirings and the plurality of fourth wirings.

10. The flexible touch panel according to claim 9, wherein:
    the first transparent electrodes contact the plurality of first wirings and the plurality of second wirings; and
    the second transparent electrodes contact the plurality of third wirings and the plurality of fourth wirings.

11. The flexible touch panel according to claim 1, wherein the plurality of first wirings, the plurality of second wirings, the plurality of third wirings, and the plurality of fourth wirings are formed of a light-shielding metal.

12. An organic light emitting display device comprising:
    a flexible base substrate;
    a first block array including a plurality of first blocks formed by a first intersection between a plurality of first wirings and a plurality second wirings on the flexible base substrate, each first block being spaced apart from one another in a first direction;
    a second block array including a plurality of second blocks formed by a second intersection between a plurality of third wirings and a plurality fourth wirings on the flexible base substrate, each second block being disposed in a second direction;
    bridge electrodes overlapping the plurality of first wirings and the plurality of second wirings at facing parts of adjacent first blocks of the first block array;
    connection electrodes in the same layer as the plurality of third wirings and the plurality of fourth wirings and connected integrally with the plurality of third wirings and the plurality of fourth wirings of adjacent second blocks;
    transparent capping electrodes including at least three intersection points between the plurality of first wirings and the plurality of second wirings in each of the adjacent first blocks of the first block array and overlapping the bridge electrodes;
an opposite substrate located opposite the flexible base substrate;
touch pad electrodes located at an edge of the flexible base substrate;
a thin film transistor array and an organic light emitting diode array located on the opposite substrate so as to be opposite the first and second block arrays;
touch assistant electrodes located on the opposite substrate so as to be opposite the touch pad electrodes;
an anisotropic conductive film provided between the touch pad electrodes and the touch assistant electrodes and including conductive balls; and
an adhesive layer filling a space between the organic light emitting diode array and the first and second block arrays.

13. A flexible touch panel comprising:
a flexible base substrate;
a plurality of first blocks formed by intersecting first wirings and second wirings, each first block being spaced apart from one another in a first direction;
a plurality of second blocks formed by intersecting third wirings and fourth wirings, each second block being disposed in a second direction;
bridge electrodes overlapping the first wirings and the second wirings of adjacent first blocks;
connection electrodes connected integrally with the third wirings and the fourth wirings of adjacent second blocks; and
transparent capping electrodes overlapping the bridge electrodes, and including at least three intersection points between the first wirings and the second wirings in each of the adjacent first blocks.

14. The flexible touch panel according to claim 13, wherein, in regions of the flexible touch panel provided with the transparent capping electrodes, contact holes are formed at locations between the bridge electrodes and the at least three intersection points of the first wirings and the second wirings, and the bridge electrodes are connected to the at least three intersection points with the first wirings and the second wirings.

15. The flexible touch panel according to claim 13, wherein the transparent capping electrodes have a shape covering a single rectangular area formed by the first intersection of two first wirings and the second intersection of the two second wirings in each of the plurality of first blocks.

16. The flexible touch panel according to claim 13, wherein the connection electrodes are located in separation regions between the adjacent first blocks.

17. The flexible touch panel according to 16, wherein the connection electrodes include first connection wirings and second connection wirings intersecting each other in the same shape as an intersecting shape between the third wirings and the fourth wirings.

18. The flexible touch panel according to claim 17, wherein the bridge electrodes overlap the first connection wirings and the second connection wirings.

19. The flexible touch panel according to claim 18, wherein an interlayer insulating film is provided in between a layer of the first connection wirings and the second connection wirings and a layer of the bridge electrodes.

20. The flexible touch panel according to claim 13, further comprising:
first transparent electrodes spaced apart from the transparent capping electrodes and covering the at least three intersection points between the first wirings and the second wirings in the first blocks; and
second transparent electrodes covering at least three intersection points between the third wirings and the fourth wirings in the plurality of second blocks.

* * * * *